United States Patent
Lee et al.

(10) Patent No.: US 8,102,118 B2
(45) Date of Patent: Jan. 24, 2012

(54) WHITE ORGANIC LIGHT EMITTING DEVICE AND COLOR DISPLAY APPARATUS EMPLOYING THE SAME

(75) Inventors: Sung-hun Lee, Yongin-si (KR); Shinichiro Tamura, Yongin-si (KR); Sang-yeol Kim, Yongin-si (KR); Mu-gyeom Kim, Yongin-si (KR); Jung-bae Song, Yongin-si (KR)

(73) Assignees: Samsung Electronics Co., Ltd., Yeongtong-gu, Suwon-si, Gyeonggi-do (KR); Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 347 days.

(21) Appl. No.: 12/155,236

(22) Filed: May 30, 2008

(65) Prior Publication Data
US 2009/0096359 A1    Apr. 16, 2009

(30) Foreign Application Priority Data
Oct. 16, 2007    (KR) .................. 10-2007-0104029

(51) Int. Cl.
*H05B 33/00* (2006.01)
*H01J 1/62* (2006.01)

(52) U.S. Cl. ........ 313/506; 313/504; 428/690; 428/917; 257/79

(58) Field of Classification Search .............. 313/506, 313/512
See application file for complete search history.

(56) References Cited

U.S. PATENT DOCUMENTS

| | | | |
|---|---|---|---|
| 6,366,017 B1 * | 4/2002 | Antoniadis et al. | 313/506 |
| 2004/0140757 A1 * | 7/2004 | Tyan et al. | 313/504 |
| 2005/0110400 A1 * | 5/2005 | Nakamura | 313/506 |
| 2005/0208330 A1 * | 9/2005 | Raychaudhuri et al. | 428/690 |
| 2005/0249972 A1 * | 11/2005 | Hatwar et al. | 428/690 |
| 2006/0102912 A1 * | 5/2006 | Abe et al. | 257/88 |
| 2006/0113529 A1 * | 6/2006 | Lee et al. | 257/40 |
| 2006/0279190 A1 * | 12/2006 | Nakayama | 313/113 |
| 2007/0046180 A1 * | 3/2007 | Kao et al. | 313/504 |
| 2008/0203908 A1 * | 8/2008 | Hasegawa et al. | 313/504 |

FOREIGN PATENT DOCUMENTS
JP    2002278477 A    *    9/2002

OTHER PUBLICATIONS
English abstract of JP 2002278477 A to Yokogawa Sep. 27, 2002.*

* cited by examiner

*Primary Examiner* — Sikha Roy
(74) *Attorney, Agent, or Firm* — Robert E. Bushnell, Esq.

(57) ABSTRACT

An organic light emitting device (OLED) having increased light output efficiency and a wide color gamut, and a color display apparatus employing the OLED, includes: a substrate; a reflective electrode formed on the substrate; an organic light emitting layer formed on the reflective electrode; a semi-transparent or transparent electrode formed on the organic light emitting layer; and an optical path control layer formed on the semi-transparent or transparent electrode and formed of a light transmitting material. In the OLED, resonators are formed between the reflective electrode and the semi-transparent or transparent electrode, between the reflective electrode and the top surface of the optical path control layer, and between the top surface of the semi-transparent or transparent electrode and the top surface of the optical path control layer, respectively, therefore, as an optical mode output to the exterior of the optical path control layer, at least two multiple resonances are generated.

22 Claims, 10 Drawing Sheets

WHITE ORGANIC LIGHT EMITTING DEVICE AND COLOR DISPLAY APPARATUS EMPLOYING THE SAME

CLAIM OF PRIORITY

This application makes reference to, incorporates the same herein, and claims all benefits accruing under 35 U.S.C. §119 from an application for PLASMA DISPLAY PANEL WITH IMPROVED BARRIER RIB STRUCTURE earlier filed in the Korean Intellectual Property Office on Oct. 16, 2007 and there duly assigned Serial No. 10-2007-0104029.

BACKGROUND OF THE INVENTION

1. Field of the Invention

The present invention relates to a white organic light emitting device (OLED) and a color display apparatus using the same, and more particularly, to a top emission type white OLED realizing high resolution and having a wide color gamut, and a color display apparatus using the same.

2. Description of the Related Art

An organic light emitting device (OLED) is a display device which forms images by emitting light when holes supplied from an anode and electrons supplied from a cathode are combined in an organic light emitting layer formed between an anode and a cathode. The OLED has excellent display characteristics such as a wide viewing angle, high response speed, a small thickness, low manufacturing costs, and high contrast ratio, and thus has recently become considered as a next-generation flat panel display device.

In general, in order to obtain improved light emitting characteristics, the OLED may have a multi-layered structure further including a hole injection layer and a hole transporting layer formed between the anode and the organic light emitting layer, and an electron injection layer and an electron transporting layer formed between the cathode and the organic light emitting layer. In addition, layers other than the above-described layers may be additionally formed.

The OLED may be designed to emit a desired colorful light by forming the organic light emitting layer by using an appropriate material. According to this principle, a color display apparatus may be realized using the OLED. For example, in a color display apparatus using the OLED, each pixel may be formed of a sub-pixel having an organic light emitting layer emitting a red color, a sub-pixel having an organic light emitting layer emitting a green color, and a sub-pixel having an organic light emitting layer emitting a blue color. Forming organic light emitting layers separately for each sub-pixel, however, causes manufacturing processes to become unnecessarily be more complicated, making the realization of a large surface and high resolution display device difficult.

Consequently, a white OLED has been suggested. A white OLED may be realized by forming a plurality of organic light emitting materials separately emitting red, green, and blue colors in an organic light emitting layer, or by forming pairs of two organic light emitting materials in a complementary color relationship. When using a white OLED, colors are attained by using color filters. In this case, the structure of the organic light emitting layer of all sub-pixels can be formed identically, and thus it is relatively easy to manufacture a large surface and high resolution display device.

Meanwhile, OLEDs may be classified into a bottom emission type OLED and a top emission type OLED, according to the direction in which light generated from an organic light emitting layer is emitted. In a bottom emission type OLED, light is extracted through a bottom surface on which a thin film transistor (TFT) driving the OLED is formed. On the other hand, in a top emission type OLED, a reflective electrode is formed in a lower portion of an organic light emitting layer and light is extracted through an upper portion of the TFT. In general, the top emission type OLED is more advantageous in terms of achieving high resolution since it can have a greater light emitting area (aperture ratio) than the bottom emission type OLED.

In the top emission type OLED, however, a resonance cavity is necessarily formed between the reflective electrode of the organic light emitting layer and a semi-transparent electrode in the upper portion of the organic light emitting layer. Resonance generated in such a resonance cavity narrows spectrums of light emitted to the exterior, and thus being advantageous in terms of extracting light of a predetermined wavelength only, but disadvantageous in terms of extracting white light.

Consequently, an OLED that outputs light with a predetermined wavelength in a single resonating mode has been suggested. In this case, however, the optical thickness of a resonance cavity must vary according to the light wavelengths. Accordingly, in order to manufacture a color display apparatus using such OLED, the optical thickness of the resonance cavity should be varied according to sub-pixels of each color, and this, in return, further complicates the manufacturing process.

SUMMARY OF THE INVENTION

It is therefore an object of the present invention to provide an improved top emission type white organic light emitting device (OLED) in order to overcome the disadvantages stated above.

It is another object of the present invention to provide a top emission type white organic light emitting device (OLED) having improved light output efficiency and a wide color gamut, by simply realizing multiple resonating modes.

According to an aspect of the present invention, there is provided an organic light emitting device (OLED) including a substrate; a reflective electrode formed on the substrate; an organic light emitting layer formed on the reflective electrode; a semi-transparent or transparent electrode formed on the organic light emitting layer; and an optical path control layer formed on the semi-transparent or transparent electrode and formed of a light transmitting material, wherein a resonator is formed between the reflective electrode and the semi-transparent or transparent electrode, between the reflective electrode and the top surface of the optical path control layer, and between the top surface of the semi-transparent or transparent electrode and the top surface of the optical path control layer, respectively, so that, as an optical mode output to the exterior of the optical path control layer, at least two multiple resonances are generated.

The optical path control layer may be formed of a material having a light transmittivity of 90% or greater in the visible light region.

The optical path control layer may be formed of at least one combination selected from the group consisting of $Al_2O_3$, $BaO$, $MgO$, $HfO_2$, $ZrO_2$, $CaO_2$, $SrO_2$, $Y_2O_3$, $Si_3N_4$, $AlN$, $GaN$, $ZnS$, and $CdS$.

The thickness of the optical path control layer may be 300 nm–900 nm.

A reflectivity of the semi-transparent or transparent electrode may be in a range of 0.1% to 50%, preferably in a range of 0.1% to 30%.

The semi-transparent or transparent electrode may be formed of a thin metal or a transparent conductive oxide.

The reflective electrode may have one of a transparent conductive oxide/metal/transparent conductive oxide structure and a metal/transparent conductive oxide structure.

The OLED may further comprise a low refractive index layer formed on the optical path control layer formed of a gas or a low refractive index filler.

The refractive index of the low refractive index may be smaller than 1.4.

The OLED may further includes a multiple-layered dielectric mirror layer, in which dielectric layers having a high refractive index and dielectric layers having a low refractive index are repeated, formed on the optical path control layer, or a mirror of a thin metal layer formed on the optical path control layer.

The organic light emitting layer may include a hole injection layer, a hole transporting layer, a light emitting layer, an electron transporting layer, and an electron injection layer stacked between the reflective electrode and the semi-transparent or transparent electrode.

The light emitting layer may be a white light emitting layer including a red light emitting layer, a green light emitting layer, and a blue light emitting layer.

The light emitting layer may be a monochromic light emitting layer including one of a red light emitting layer, a green light emitting layer, and a blue light emitting layer.

According to another aspect of the present invention, there is provided a color display apparatus including: a bottom substrate; a plurality of reflective electrodes formed on the bottom substrate; an organic light emitting layer formed on the reflective electrodes; a semi-transparent or transparent electrode formed on the organic light emitting layer; an optical path control layer formed on the semi-transparent or transparent electrode and formed of a light transmitting material; and a top substrate disposed to face the optical path control layer, wherein a resonator is formed between the reflective electrode and the semi-transparent or transparent electrode, between the reflective electrode and the top surface of the optical path control layer, and between the top surface of the semi-transparent or transparent electrode and the top surface of the optical path control layer, respectively, so that, as an optical mode output to the exterior of the optical path control layer, at least two multiple resonances are generated.

The color display apparatus may further include a plurality of color filters formed to respectively correspond to the reflective electrodes on a bottom surface of the top substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully with reference to the accompanying drawings, in which exemplary embodiments of the invention are shown. In the drawings, like reference numerals denote like elements, and the size of the elements may be exaggerated for clarity and convenience of description.

Figure 1:
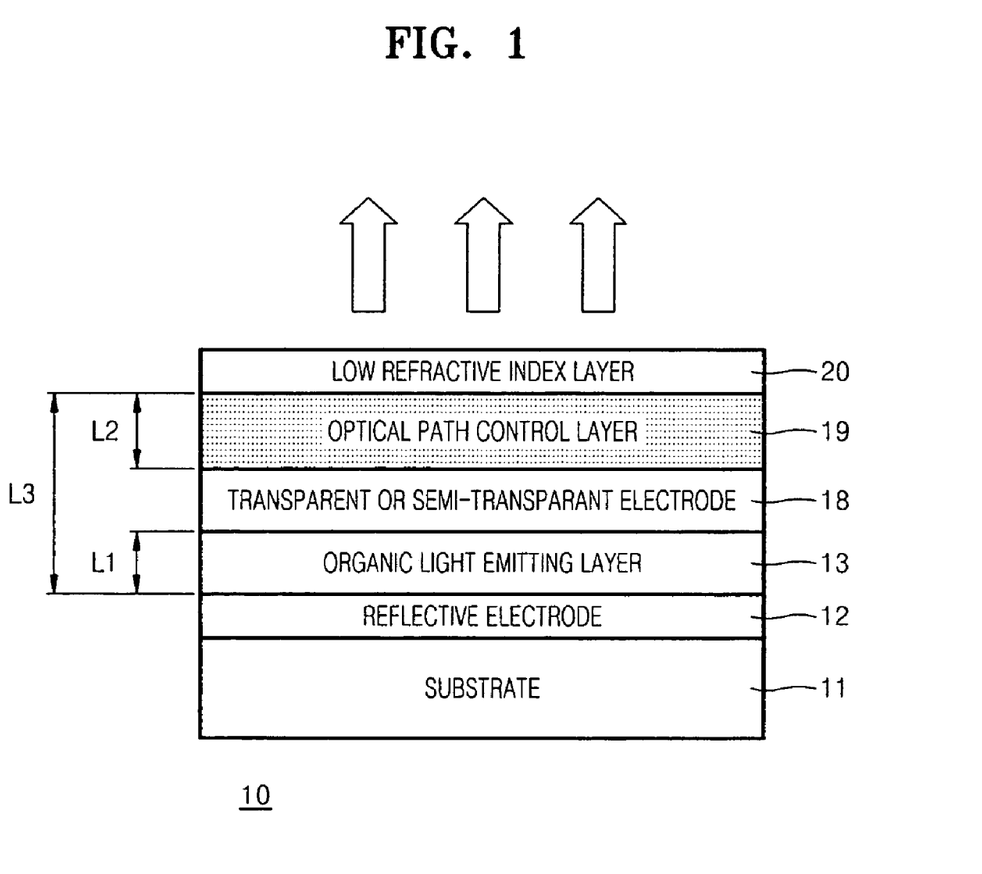
FIG. 1 is a schematic view of a white organic light emitting device (OLED) constructed as an embodiment of the present invention.

FIG. 1 is a schematic view of a top emission type white organic light emitting device (OLED) 10, according to an embodiment of the present invention. Referring to FIG. 1, white OLED 10 includes a reflective electrode 12, an organic light emitting layer 13, a semi-transparent or transparent electrode 18, an optical path control layer 19, and a low refractive index layer 20 sequentially stacked on a substrate 11. Substrate 11 may be formed of glass, and a thin film transistor (TFT) may be formed on substrate 11 to control the operation of light emission of organic light emitting layer 13. Organic light emitting layer 13 may have a light emitting structure of a general OLED that is well-known to one skilled in the art. For example, organic light emitting layer 13 may be formed of multiple layers such as an electron injection layer, an electron transporting layer, a light emitting layer, a hole transporting layer, and a hole injection layer. In particular, in order to emit white light, a number of light emitting materials that emit different colors may be formed together in organic light emitting layer 13.

For top emission, reflective electrode 12 is disposed under organic light emitting layer 13, and semi-transparent or transparent electrode 18 is disposed on organic light emitting layer 13. According to embodiments, reflective electrode 12 may be an anode and semi-transparent or transparent electrode 18 may be a cathode; or, reversely, reflective electrode 12 may be a cathode and semi-transparent or transparent electrode 18 may be an anode. A portion of light emitted from organic light emitting layer 13 is reflected by semi-transparent or transparent electrode 18 and resonates between semi-transparent or transparent electrode 18 and reflective electrode 12. Accordingly, a spectrum of externally emitted light may be concentrated within a predetermined wavelength bandwidth according to the resonance characteristics of the light. And this may deteriorate the quality of white light.

According to the current embodiment of the present invention, in order to increase the quality of white light emitted to the exterior of white OLED 10, a predetermined thickness of organic light emitting layer 13 between semi-transparent or transparent electrode 18 and reflective electrode 12 is maintained constant, and optical path control layer 19 is introduced on semi-transparent or transparent electrode 18 to optimize the optical thickness of a resonator. The inventors of the present invention have discovered that the quality of white light may be improved by properly selecting a resonance condition when introducing optical path control layer 19 in white OLED 10 having the above-described structure. In general, the wavelength of a resonating mode of a resonator, that is, a resonance wavelength, is determined by the optical thickness of the resonator. Also, if the optical thickness of the resonator is large, multiple resonating modes are present in the visible light region of the wavelengths of 400 nm-700 nm. Accordingly, when the optical thickness of optical path control layer 19 is properly adjusted in white OLED 10, a multiple mode resonance may be designed to be similar to an internal organic light emitting spectrum of red, green, and blue light.

According to the Febry-Perot interference condition, the condition for a resonating mode to exist in white OLED 10, in which organic light emitting layer 13 and semi-transparent or transparent electrode 18 between optical path control layer 19 and reflective electrode 12 are formed of a plurality of layers, is as the following Equation (1):

$$2\pi \cdot q = \sum_j \left( \frac{2\pi 2 n_{j\lambda} d_j}{\lambda} + \delta_j \right), \quad (1)$$

where $n_{j\lambda}$ is a refractive index of a j-th layer of white OLED 10 with respect to a wavelength $\lambda$, $d_j$ is the thickness of a j-th layer, and $\delta_j$ is the degree of phase shift shown when light is transmitted through the j-th layer and when light is reflected from optical path control layer 19, semi-transparent or transparent electrode 18, and reflective electrode 12. Also, q is an arbitrary integer. Here, when the optical thickness becomes very large, there are multiple solutions satisfying different values of q at different wavelengths.

Figure 13:
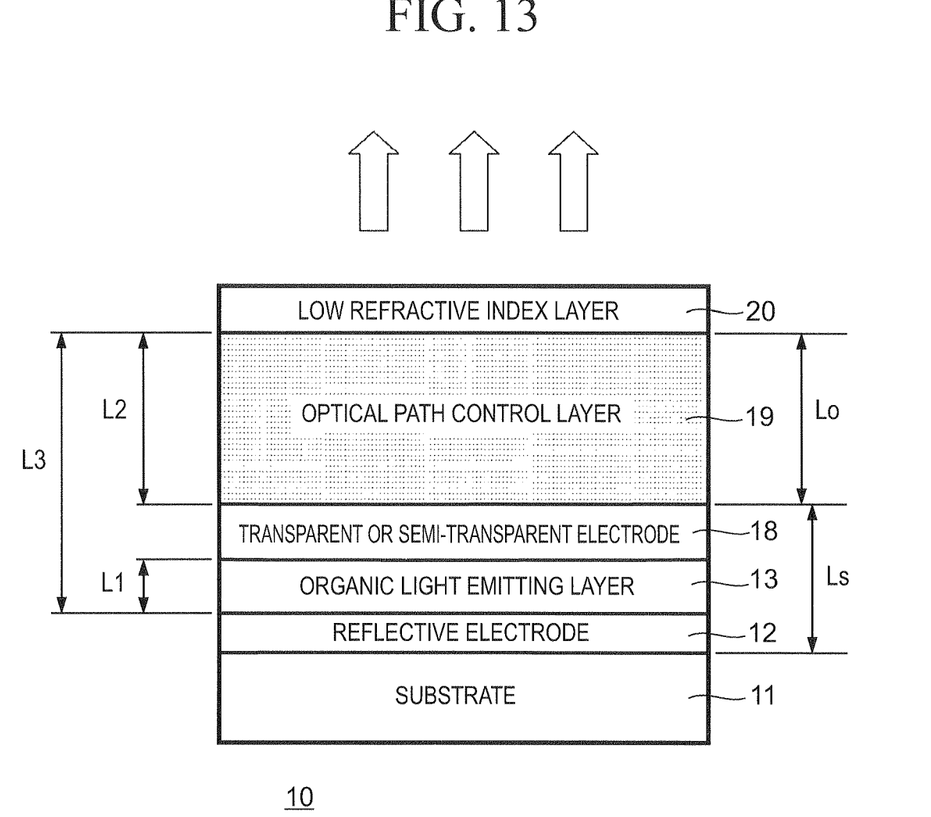
FIG. 13 is a schematic view of a white organic light emitting device (OLED) constructed as another embodiment of the present invention.

In order to satisfy the above conditions, it is preferable to make the thickness of optical path control layer 19 large enough to obtain effective multiple resonances, although optical path control layer 19 is illustrated to be thin for convenience in FIG. 1. In fact, as shown in FIG. 13, the thickness (Lo) of optical path control layer 19 may be larger than the total thickness (Ls) of semi-transparent or transparent electrode 18, reflective electrode 12, and organic light emitting layer 13. For example, optical path control layer 19 may preferably have a thickness of 300 nm-400 nm at the minimum, and 700 nm-800 nm at the maximum.

Also, in order to reduce reflection on organic light emitting layer 13, semi-transparent or transparent electrode 18, and optical path control layer 19, the refractive index of the optical path control layer 19 may preferably be similar to that of organic light emitting layer 13. For example, the refractive index of optical path control layer 19 may preferably be in the range of about 1.6 to 2.4 in the visible light region. In addition, in order to minimize light loss inside optical path control layer 19, optical path control layer 19 may preferably have good light transmittivity. For example, the light transmittivity of optical path control layer 19 may be approximately 90% or greater in the visible light region. For example, optical path control layer 19 may preferably be formed of at least one combination selected from the group consisting of $Al_2O_3$, $BaO$, $MgO$, $HfO_2$, $ZrO_2$, $CaO_2$, $SrO_2$, $Y_2O_3$, $Si_3N_4$, $AlN$, $GaN$, $ZnS$, and $CdS$.

Low refractive index layer 20, formed of a gas or a low refractive index filler, is formed on a top surface of optical path control layer 19. The low refractive index layer 20 enables the top surface of the optical path control layer 19 to easily reflect light due to difference in refractive indices between the low refractive index layer 20 and the optical path control layer 19, and may preferably have a refractive index smaller than 1.4. Low refractive index layer 20 indicates not only a physical layer that is additionally stacked on optical path control layer 19 but may be simply air outside of optical path control layer 19 or a kind of gas. In particular, when white OLED 10 is encapsulated in a pixel of a display apparatus, low refractive index layer 20 may indicate a material filled in the inner space of the pixel. Consequently, the presence of low refractive index layer 20 may be regarded as that another material having a high refractive index is not formed on the top surface of optical path control layer 19 so that light can be easily reflected from the top surface of optical path control layer 19. For example, when white OLED 10 is encapsulated with an encapsulation material such as glass, such encapsulation material does not directly contact optical path control layer 19 since low refractive index layer 20 is interposed between optical path control layer 19 and the encapsulation material.

Also, although not illustrated in the drawing, when optical path control layer 19 and another layer having a refractive index of 1.4 or greater, for example, a color filter, directly physically contact each other, a multiple-layered dielectric mirror, in which dielectric layers having a high refractive index and dielectric layers having a low refractive index may be alternately layered, or a thin metal layer may be further formed on the top surface of optical path control layer 19 in order to increase reflectivity.

In white OLED 10 of the present embodiment, a first resonator L1 is formed between reflective electrode 12 and semi-transparent or transparent electrode 18, a second resonator L2 is formed between the top and bottom surfaces of optical path control layer 19, and a third resonator L3 is formed between the top surface of optical path control layer 19 and reflective index 12. When the reflectivity of semi-transparent or transparent electrode 18 is large, resonance is generated mainly between reflective electrode 12 and semi-transparent or transparent electrode 18. As a result, when the reflectivity of semi-transparent or transparent electrode 18 is too large, the effect of multiple resonances is decreased. Considering this, according to the present invention, the reflectivity of semi-transparent or transparent electrode 18 may be about 0.1-50%, and preferably about 0.1-30%. According to the present invention, using the multiple resonances of optical path control layer 19, a spectrum of white light emitted in white OLED 10 may be distributed broadly over the whole visible light region and peaks may be formed in each of red, green, and blue light regions. Therefore, light output efficiency may be increased as compared to the case where spectrums having uniform intensities are formed with respect to all wavelengths without having peaks in the visible light region.

In order to see these characteristics of the present invention, a computer simulation was performed on two OLEDs having two different configurations. One of the OLEDs is an exemplary OLED generating multiple resonances through optical path control layer 19 as in the current embodiment of the present invention, and the other OLED is a comparison example which generates resonance only between reflective electrode 12 and semi-transparent or transparent electrode 18, and is without optical path control layer 19.

Figure 2:
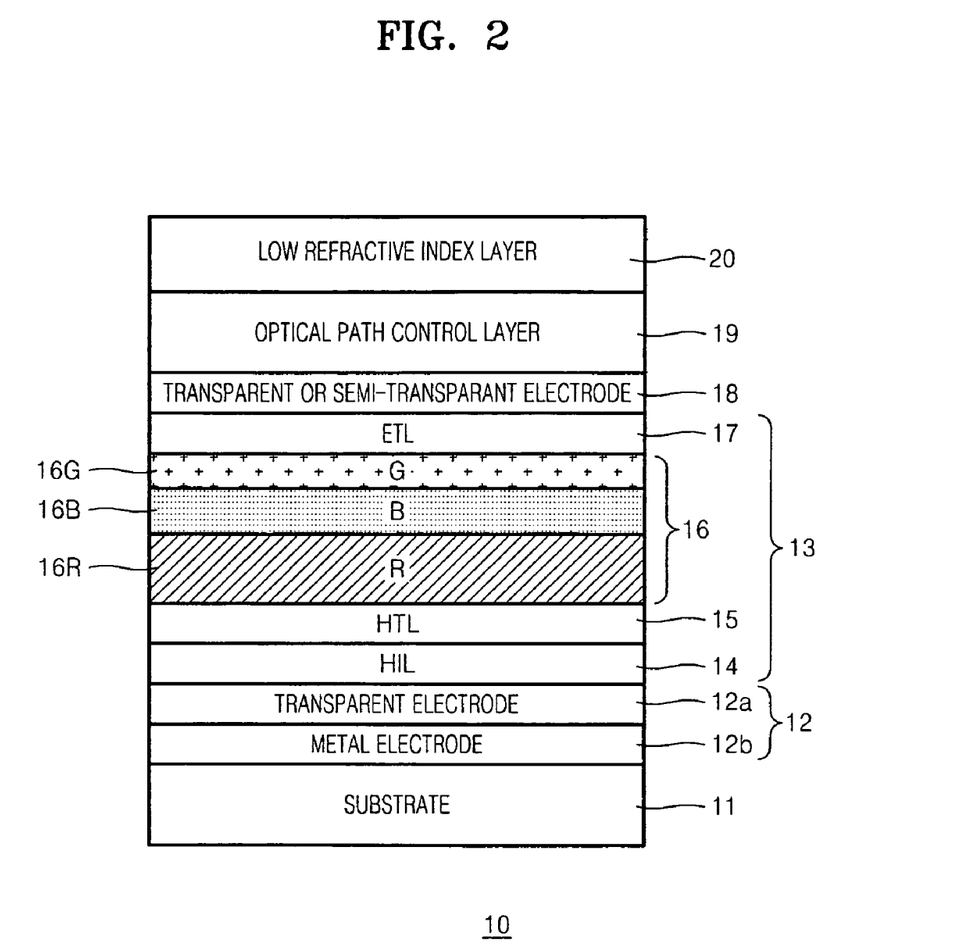
FIG. 2 is a schematic view of a detailed structure of the white OLED of FIG. 1.

First, FIG. 2 is a schematic view of a detailed structure of white OLED 10 of FIG. 1, according to an embodiment of the present invention. Referring to FIG. 2, white OLED 10 includes reflective electrode 12, a hole injection layer (HIL) 14, a hole transporting layer (HTL) 15, a white light emitting layer 16, an electron transporting layer (ETL) 17, semi-transparent or transparent electrode 18, optical path control layer 19, and low refractive index layer 20 sequentially stacked on glass substrate 11. Here, HIL 14, HTL 15, white light emitting layer 16, and ETL 17 constitute organic light emitting layer 13. Although not shown in FIG. 2, an electron injection layer may be further interposed between semi-transparent or transparent electrode 18 and ETL 17.

Here, reflective electrode 12 functions as an anode, and may be formed of a metal electrode 12b that reflects light generated in white light emitting layer 16, and a transparent electrode 12a, formed of a transparent conductive oxide (TCO) having a relatively high work function, for providing holes. For example, metal electrode 12b may be formed of a metal such as Al or Ag having high reflectivity, and transparent electrode 12a may be formed of indium tin oxide (ITO) or indium zinc oxide (IZO). In FIG. 2, a metal/TCO layer structure is illustrated; however, reflective electrode 12 may also be formed of a TCO/metal/TCO structure. Semi-transparent or transparent electrode 18 functions as a cathode, and is formed to have semi-transparent characteristics by being thinly coated by metal, such as Ag having a relatively low work function, of approximately 10 nm in thickness. In white OLED 10 with the above-described reflective electrode 12 and semi-transparent or transparent electrode 18, resonance is generated between metal electrode 12b and semi-transparent or transparent electrode 18.

FIG. 2 shows that reflective electrode 12 functions as an anode and semi-transparent or transparent electrode 18 functions as a cathode; however, the functions may be exchanged according to another embodiment. For example, when reflective electrode 12 is first formed on the substrate to function as a cathode, then ETL 17, white light emitting layer 16, HTL 15, HIL 14, and semi-transparent or transparent electrode 18 may be formed thereon to function as an anode. In this case, semi-transparent or transparent electrode 18 may be formed of a conductive oxide such as ITO or IZO instead of a thin metal, and reflective electrode 12 may be formed of only a metal.

Also, white light emitting layer 16 may be formed with various structures in order to emit white light. In FIG. 2, white light emitting layer 16 is formed of a red light emitting layer 16R, a blue light emitting layer 16B, and a green light emitting layer 16G. White light emitting layer 16 however may also be formed of two kinds of light emitting materials emitting color lights in a complementary color relationship.

Figure 3:
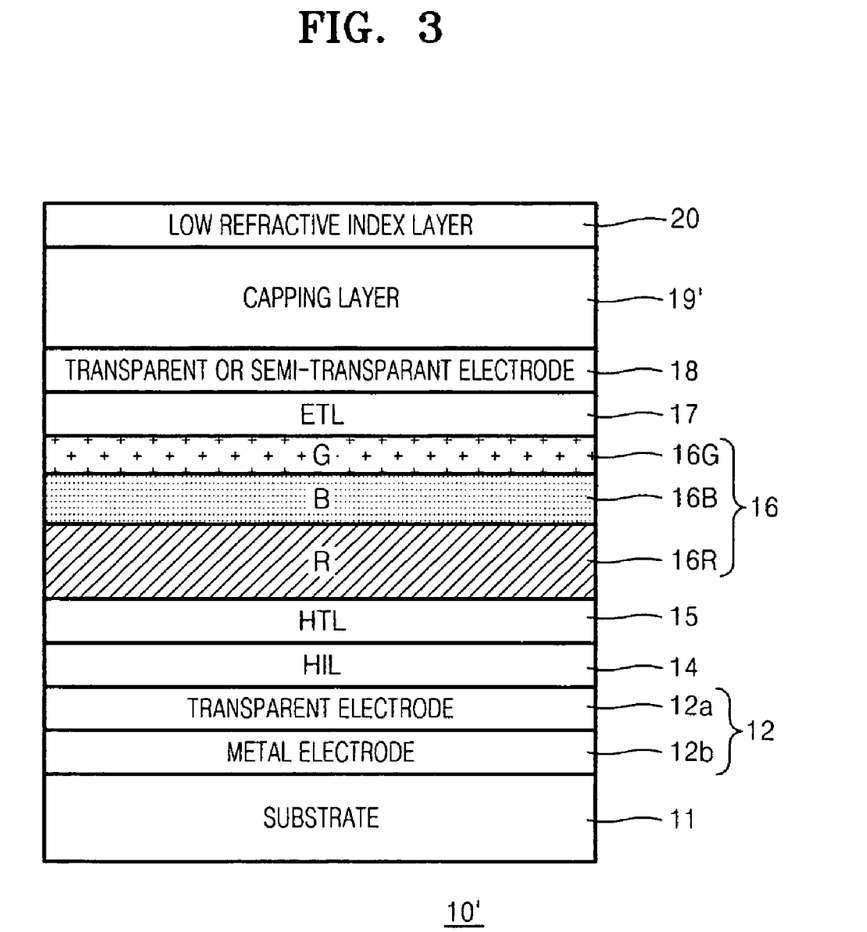
FIG. 3 is a schematic view of a contemporary white OLED as a comparison example.

FIG. 3 is a schematic view of a white OLED 10' of a top emission type, which is without optical path control layer 19, as a comparison example. White OLED 10' has a capping layer 19' that replaces optical path control layer 19 of white OLED 10 illustrated in FIG. 2. Here, capping layer 19' is formed of the same material as optical path control layer 19, but has a very small thickness as compared to that of optical path control layer 19, so as not to generate effective multiple resonances. Thus, a very broad single mode resonance is generated as an optical mode output to the exterior of capping layer 19', in the visible light region.

First Computer Simulation is Performed in the Case Where Optical Path Control Layer 19 is Not Employed.

Figure 4:
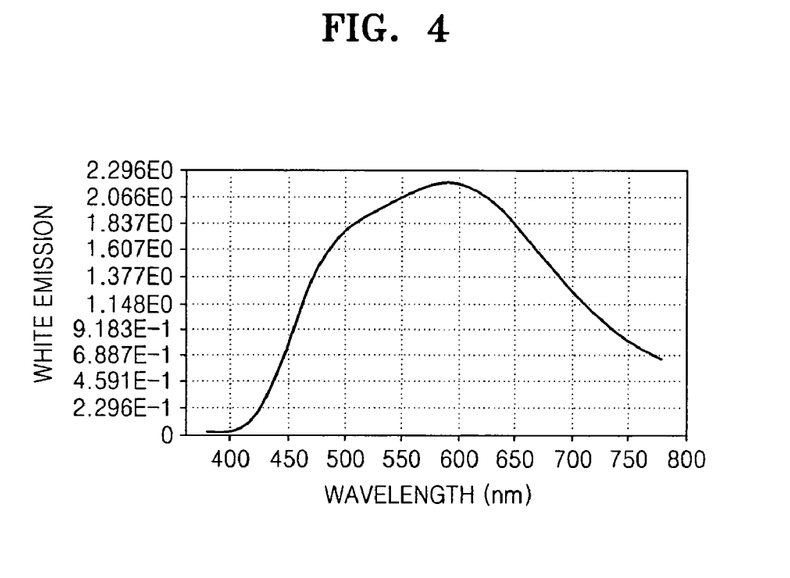
FIG. 4 is a two dimensional computer simulated graph of the amount of light of white point light sources, which is emitted at a predetermined light emitting position in the white OLED of FIG. 3 to the exterior when the resonance condition according to the principle of the present invention is satisfied.
Figure 5:
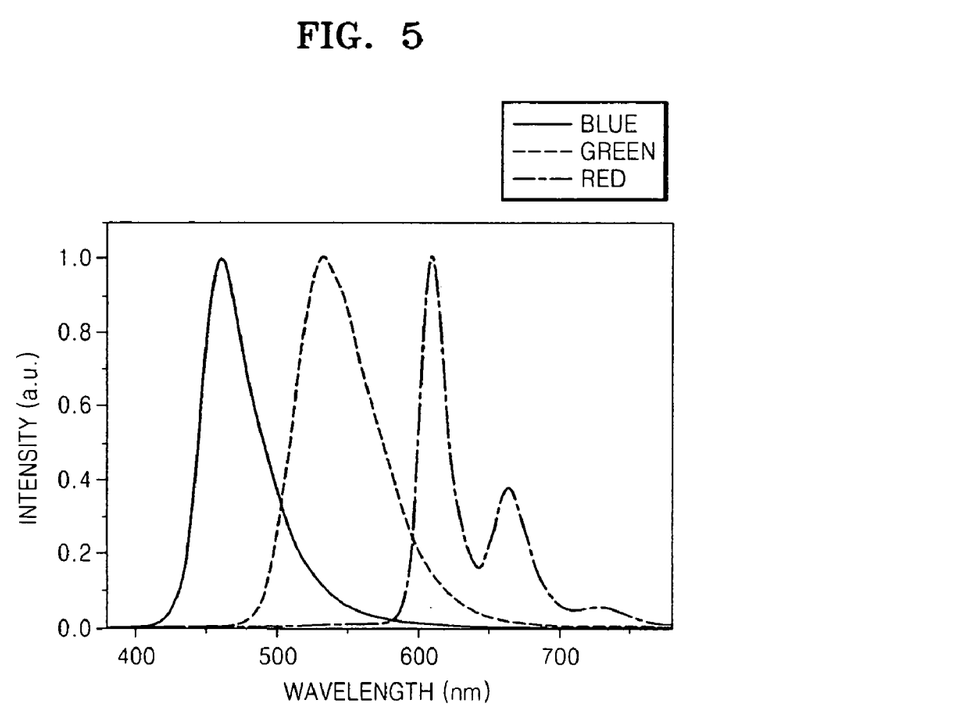
FIG. 5 is a two dimensional graph showing internal light emitting spectrums of red, blue, and green color light generated respectively by red, blue, and green light emitting layers.
Figure 6:
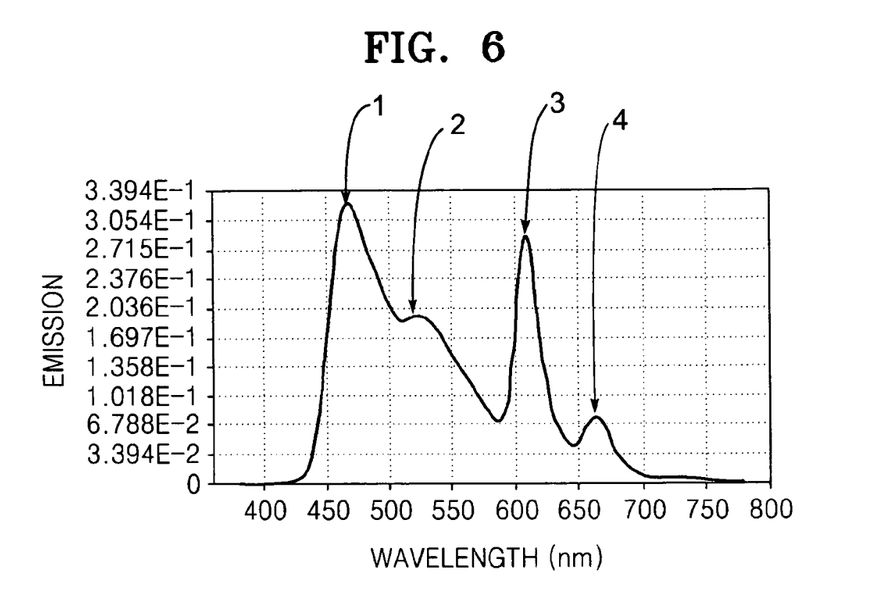
FIG. 6 is a two dimensional computer simulated graph of the amount of light of red, blue, and green point light sources, which is emitted at a predetermined light emitting position in the white OLED of FIG. 3 to the exterior when the resonance condition according to the present invention is satisfied.

Referring now to FIGS. 4-6, a first computer simulation was performed where optical path control layer 19 is not employed in such a manner that the optical thickness between metal electrode 12b and semi-transparent or transparent electrode 18 was 200 nm, the wavelength of a resonating mode, that is, a resonance wavelength, considering phase shift, was 314 nm, and the thickness of capping layer 19' was 40 nm in white OLED 10' having the structure illustrated in FIG. 3. In addition, it was assumed that white point light sources having identical intensities are respectively disposed at red light emitting layer 16R, blue light emitting layer 16B, and green light emitting layer 16G in white light emitting layer 16 illustrated in FIG. 3.

FIG. 4 is a computer simulation graph showing the amount of light emitted to the exterior from each white point light source under the above-described conditions. Referring to FIG. 4, in general, a resonance characteristic is relatively broadly and uniformly formed in the visible light region.

Also, red, blue, and red light spectrums as illustrated in FIG. 5 were assumed in order to predict spectrums using the result of FIG. 4 for the case in which red, blue, and green light is respectively emitted from red light emitting layer 16R, blue light emitting layer 16B, and green light emitting layer 16G to the outside. That is, FIG. 5 is a graph showing internal light emitting spectrums of red, blue, and green light generated from red light emitting layer 16R, blue light emitting layer 16B, and green light emitting layer 16G, respectively.

FIG. 6 is a computer simulation graph of an external light emitting spectrum obtained by multiplying the result of FIG. 4 with the internal light emitting spectrums of red, green, and blue light of FIG. 5 at a ratio of 2.3:0.6:2.

Since the graph of FIG. 5 is based on a normalized value, the ratio is multiplied with the internal light emitting spectrums of FIG. 5 to obtain the actual characteristics of the manufactured white light emitting layer 16. Accordingly, the graph of FIG. 6 shows a computer simulation in terms of the amount of red, blue, and green light respectively emitted from red light emitting layer 16R, blue light emitting layer 16B, and green light emitting layer 16G in white OLED 10' to the exterior. Peak 1 represents the amount of blue light emitted from blue light emitting layer 16B, peak 2 represents the amount of green light emitted from blue light emitting layer 16G, and peaks 3 and 4 represents the amount of red light emitted from red light emitting layer 16R. A white spectrum at (0.31, 0.32) of the chromaticity coordinates can be obtained from graph of FIG. 6.

Second Computer Simulation is Performed in the Case Where Optical Path Control Layer 19 is Employed.

Figure 7:
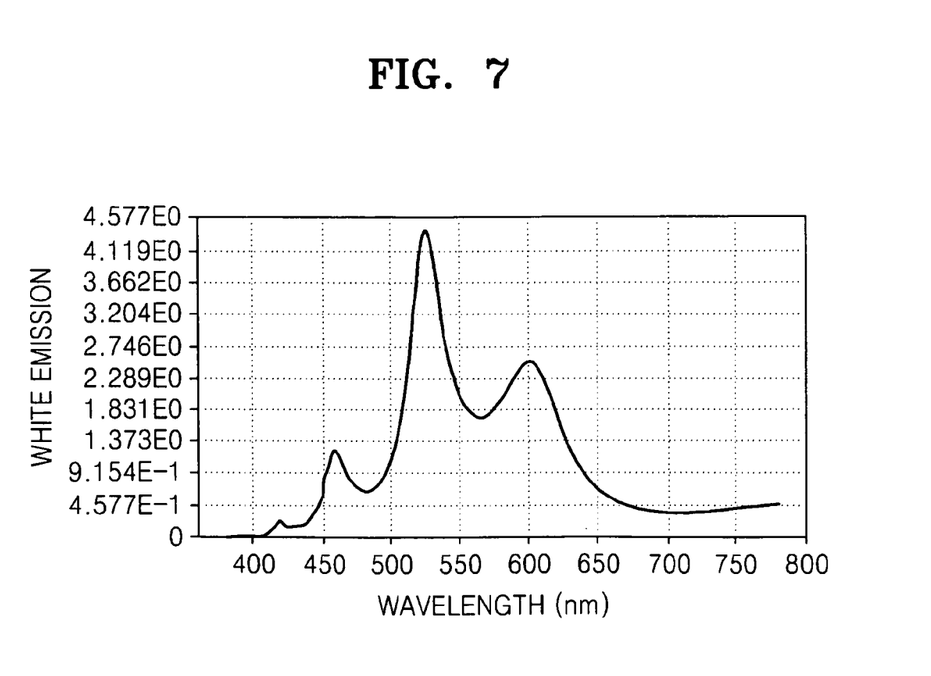
FIG. 7 is a two dimensional computer simulated graph of the amount of light of a white point light source emitted at a predetermined light emitting position in the white OLED of FIG. 2 to the outside when a multiple resonance condition according to the present invention is satisfied.
Figure 8:
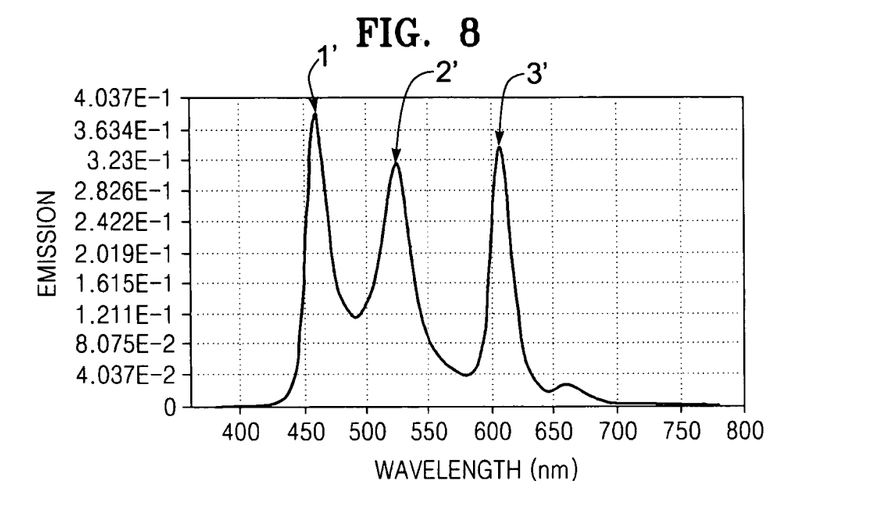
FIG. 8 is a two dimensional computer simulated graph of the amount of light of red, blue, and green point light sources emitted at a predetermined light emitting position in the white OLED of FIG. 2 to the outside when the multiple resonance condition according to the present invention is satisfied.

Referring to FIGS. 7 and 8 collectively, a second computer simulation was performed where optical path control layer 19 is employed in such a manner that an optical thickness between metal electrode 12b and semi-transparent or transparent electrode 18 was 200 nm, the resonance wavelength, considering the phase shift, was 314 nm, and the thickness of optical path control layer 19 was 490 nm in white OLED 10 having the structure described in FIG. 2. The assumption is that the refractive index of optical path control layer 19 was 2 and an absorption coefficient was 0 at a wavelength of 550 nm. The reflectivity of semi-transparent or transparent electrode 18 was set to be 25%. In addition, it was assumed that there are white point light sources having identical intensities respectively at red light emitting layer 16R, blue light emitting layer 16B, and green light emitting layer 16G of white OLED 10.

FIG. 7 is a computer simulation graph of the amount of light emitted from each of the point light sources to the outside under the above-described conditions. Referring to FIG. 7, while peaks are divided in the red region, green, and blue regions, overall, the resonance characteristic is broadly formed in the visible light region.

Also, FIG. 8 is a computer simulation graph of an external light emitting spectrum obtained by multiplying the result of the graph of FIG. 7 with the internal light emitting spectrums of red, green, and blue light of FIG. 5 at a ratio of 2.3:0.6:2. In other words, FIG. 8 is a computer simulation graph of the amount of red, blue, and green light respectively emitted from red light emitting layer 16R, blue light emitting layer 16B, and green light emitting layer 16G of white OLED 10 of FIG. 2 to the exterior. Peak 1' represents the amount of blue light emitted from blue light emitting layer 16B, peak 2' represents the amount of green light emitted from blue light emitting layer 16G, and peaks 3' represents the amount of red light emitted from red light emitting layer 16R. Comparing the graph of FIG. 5 with the graph of FIG. 6 of the comparison example, in the current embodiment of the present invention in which multiple resonances are generated, three distinct peaks are generated in the wavelengths corresponding to the three primary colors of light. As can be seen from FIG. 8, a purer white spectrum at (0.298, 0.341) of the chromaticity coordinates can be obtained.

Figure 9:
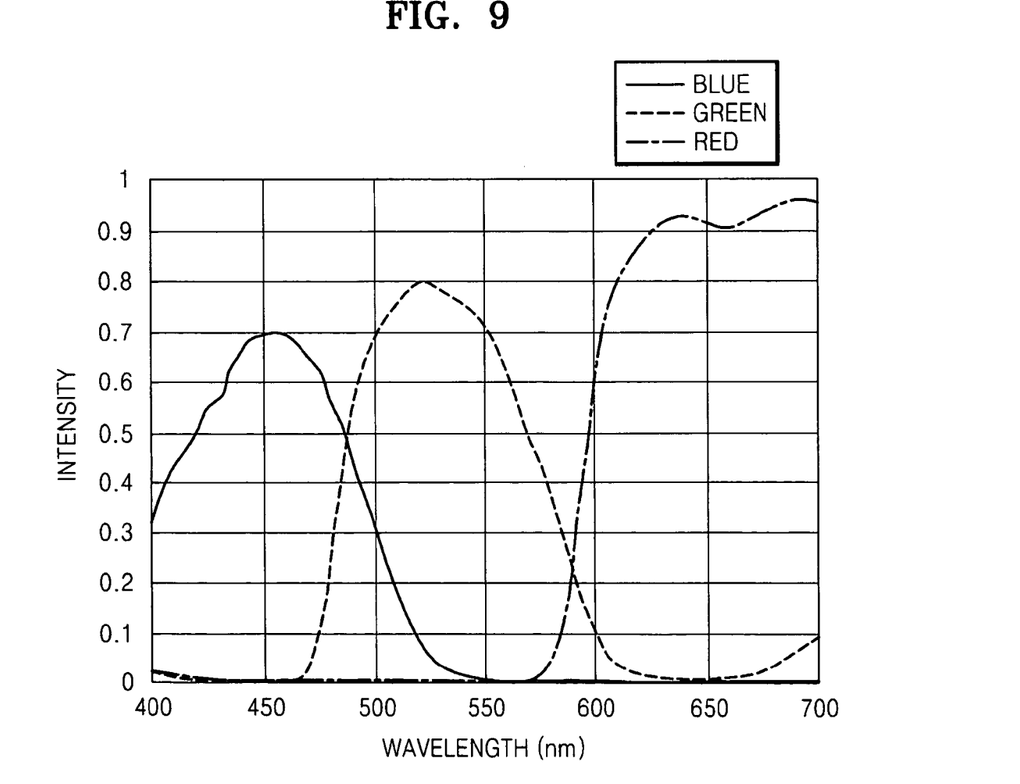
FIG. 9 is a two dimensional graph showing transmittivity spectrums of color filters used in a computer simulation of the present invention.

FIG. 9 is a graph showing transmittivity spectrums of color filters used in a computer simulation of the present invention. Color filters as shown in FIG. 9 selectively absorb the lights having wavelengths different from a predetermined wavelength, for example, a color filter for blue light absorbs lights having wavelengths different from approximately 450 nm. When the external light emitting spectrums of FIGS. 6 and 8 are multiplied with the transmittivity spectrums of the color filters of FIG. 9, chromaticity coordinates of each color light appearing when white light emitted from white OLEDs 10' and 10 passes through the red, green, and blue color filters, and a chromaticity coordinate of the combination of these colors, that is, white color, can be obtained. The result coordinate values of color in CIE x, y chromaticity diagram are shown in Tables 1 and 2 below. Table 1 is for white OLED 10' illustrated in FIG. 3, and Table 2 is for white OLED 10 illustrated in FIG. 2. Regarding components x, y in Tables 1 and 2, components x, y are coordinate values of color in CIE x, y chromaticity diagram. Generally, a CIE system characterizes colors by a luminance parameter Y and two color coordinates x and y which specify the point on the chromaticity diagram.

Figure 10:
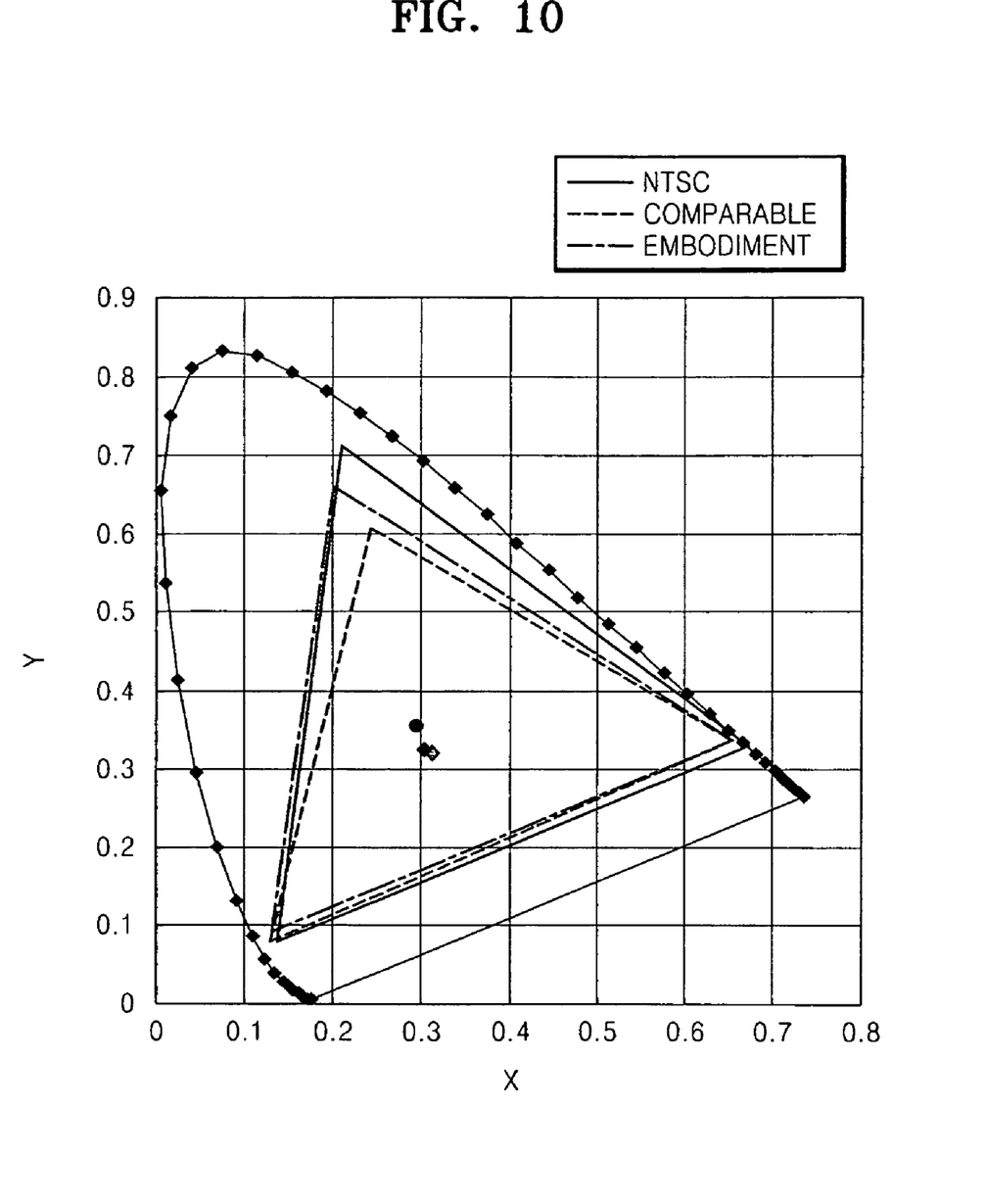
FIG. 10 is a two dimensional graph showing color reproduction range characteristics by comparing chromaticity coordinates calculated using the spectrums of FIG. 8 and the transmittivity of the color filters of FIG. 9 with chromaticity coordinates of the National Television System Committee (NTSC) color system.

Also, in order to compare the calculated chromaticity coordinates with the National Television System Committee (NTSC) color system, the chromaticity coordinates of the first and second computer simulations and the chromaticity coordinates of the NTSC color system are both shown in FIG. 10.

In FIG. 10, the outer triangle is the NTSC color system, and the innermost triangle is the chromaticity coordinates of the first computer simulation, and the middle triangle is the chromaticity coordinates of the second computer simulation. According to the first computer simulation shown in FIG. 10, almost 79% of color reproduction range can be obtained as compared to the NTSC system, whereas according to the second computer simulation, 89% of color reproduction range can be obtained as compared to the NTSC system.

TABLE 1

|  |  | x | y |
|---|---|---|---|
| original color filter | W | 0.309 | 0.321 |
|  | W | 0.303 | 0.327 |
|  | R | 0.654 | 0.336 |
|  | G | 0.242 | 0.609 |
|  | B | 0.132 | 0.082 |

TABLE 2

|  |  | x | y |
|---|---|---|---|
| original color filter | W | 0.298 | 0.341 |
|  | W | 0.295 | 0.355 |
|  | R | 0.653 | 0.338 |
|  | G | 0.201 | 0.661 |
|  | B | 0.132 | 0.091 |

A top emission type white OLED also having the structure of white OLED 10 illustrated in FIG. 1 was actually manufactured based on the result of the above-described computer simulations. According to the current embodiment of the present invention, an anode, functioning as a reflective electrode having an ITO/Ag/ITO structure, was formed on a glass substrate, and an HIL and an HTL were formed on the reflective electrode. Next, a light emitting layer that emits light in the three wavelengths, that is, blue, red, and green colors, was formed on the HTL. Then an ETL and an EIL were formed on the light emitting layer. In addition, Ag having a thickness of 9 nm is formed on the EIL as a cathode functioning as a semi-transparent electrode. The reflectivity of the semi-transparent electrode was about 25% with respect to light having a wavelength of 550 nm. An optical path control layer having a thickness of 490 nm was formed on the semi-transparent electrode. The optical path control layer had a refractive index of about 2 with respect to the wavelength of 550 nm. The top emission type white OLED manufactured in this manner was encapsulated in an inactive atmosphere.

The material and thickness of the HIL were MTDATA and 200 Å, respectively, and the material and thickness of the HTL were NPB and 110 Å, respectively, and the thickness of the blue light emitting layer was 120 Å, the thickness of the green light emitting layer was 120 Å, the thickness of the red light emitting layer was 80 Å, the material and thickness of the ETL were Alq3 and 180 Å, respectively, the material and thickness of the EIL were LiF and 7 Å, respectively, and the material of the optical path control layer was SiNx. N2 gas was used as the inactive atmosphere.

Figure 11:
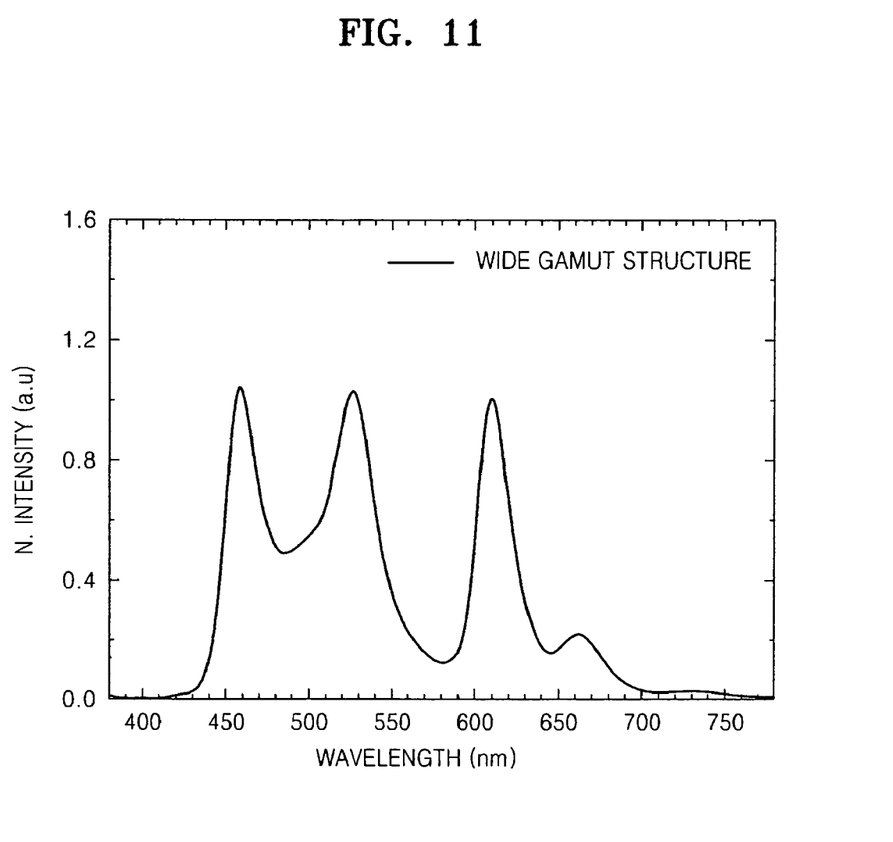
FIG. 11 is a two dimensional graph showing an external light emitting spectrum of a top emission type white OLED constructed as the present invention.

FIG. 11 is a graph showing an external light emitting spectrum of the top emission type white OLED manufactured in the above-described manner. Referring to FIG. 11, light emitted from the white OLED has three peaks in the three light wavelength regions, that is, blue, green, and red light wavelength regions. This is very similar to the result of the second computer simulation illustrated in FIG. 8. By calculating chromaticity coordinates from the result of FIG. 11, a white spectrum at (0.31, 0.34) can be found.

Figure 12:
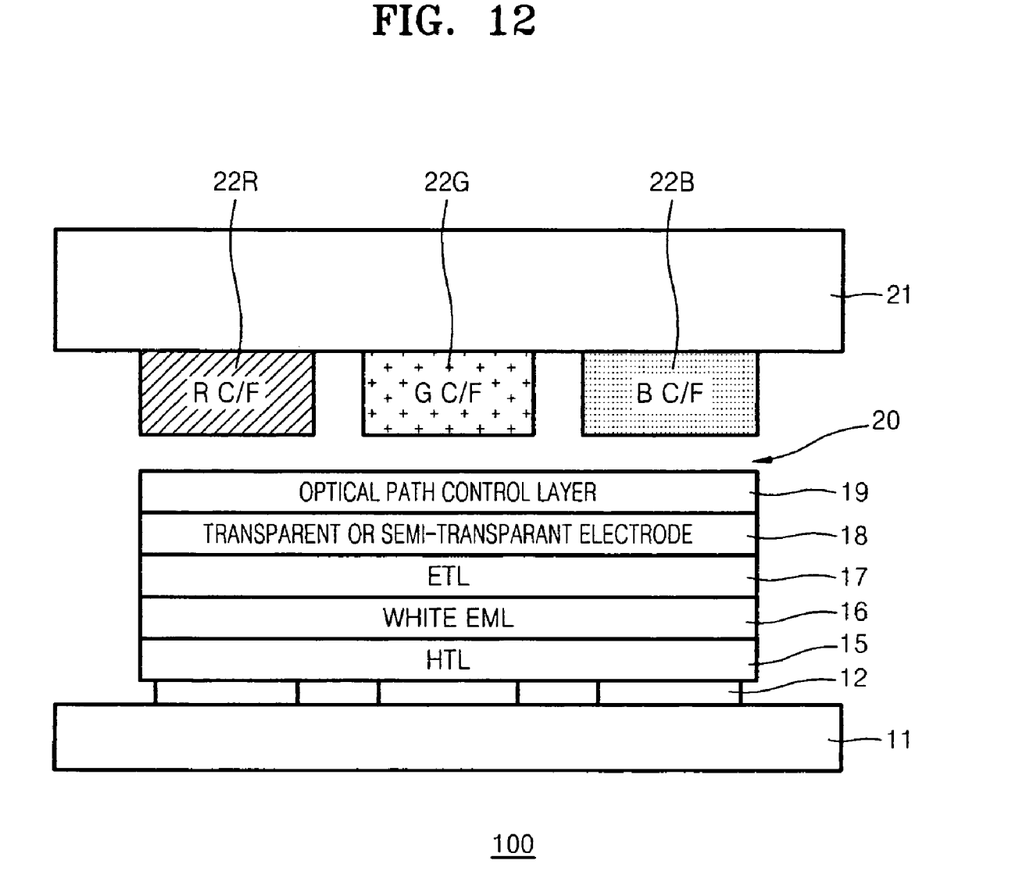
FIG. 12 is a cross-sectional view of a color display apparatus using the white OLED of FIG. 1 constructed as an embodiment of the present invention.

When white OLED 10 according to the present invention is used in a color display apparatus, a color display apparatus having high color reproduction range can be obtained. FIG. 12 is a cross-sectional view of a color display apparatus 100 using white OLED 10, of the present invention. Referring to FIG. 12, a plurality of reflective electrodes 12 are formed for each sub-pixel on substrate 11, and hole injection layer (HIL) 15, white light emitting layer (white EML) 16, electron transporting layer (ETL) 17, semi-transparent or transparent electrode 18, and optical path control layer 19 may be formed commonly on reflective electrodes 12. In addition, a transparent front substrate 21 is disposed facing optical path control layer 19, and red, green, and blue color filters 22R, 22G, and 22B are formed for each sub-pixel, on a bottom surface of front substrate 21. Although not illustrated in FIG. 12, a black matrix BM, which completely absorbs external light, may be formed between each color filter in order to increase visibility, and gas or a filler having a low refractive index may be used to fill as a low refractive index layer in the space between top substrate 21 and optical path control layer 19.

According to the present invention, as illustrated in FIG. 12, OLEDs including electrodes and light emitting layers can be formed in the same layer with respect to all sub-pixels irrespective of the colors of the sub-pixels. Also, in this case, the optical path between sub-pixels does not need to be controlled, and thus reflective electrodes 12 in the lower portion of white OLED 10 can be designed to have the same structure. Also, according to the present invention, since white OLED 10 can emit almost pure white color light, pure colors can be realized using red, green, and blue color filters 22R, 22G, and 22B. Also, even when resonance is generated inside white OLED 10, since images are viewed through red, green, and blue color filters 22R, 22G, and 22B, dependency on the viewing angle can be significantly reduced.

As described above, a method of improving the characteristics of a white OLED using a resonance characteristic has been described. The principle of the present invention however can be applied not only to white OLEDs but also to other monochromic OLEDs that are formed by an independent deposition and thus emit light of different colors for each pixel. For example, white light emitting layer 16 formed of red light emitting layer 16R, blue light emitting layer 16B, and green light emitting layer 16G is illustrated in FIG. 2; however, instead of white light emitting layer 16, a monochromic OLED including one of red light emitting layer 16R, blue light emitting layer 16B, and green light emitting layer 16G can be provided as well. In this case, when multiple resonances are generated, which is similar to red, green, and blue internal light emission, by forming monochromic OLEDs, which emit different colors deposited in three red, green, and blue sub-pixels, to have the same thicknesses and optical path control layer 19, formed in the upper portion of the semi-transparent or transparent electrode 18, with a sufficient thickness, then a monochromic OLED having a high color reproduction range and improved light output efficiency can be realized. Also, a color display apparatus using the above monochromic OLEDs as red, green, and blue sub-pixels may not use color filters 22R, 22G, and 22B illustrated in FIG. 12.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. An organic light emitting device (OLED), comprising:
    a substrate;
    a reflective electrode formed on the substrate;
    an organic white light emitting layer formed on the reflective electrode;
    a semi-transparent or transparent electrode formed on the organic white light emitting layer; and
    a single-layered optical path control layer formed immediately on the semi-transparent or transparent electrode and formed of a light transmitting material, and the optical path control layer having a uniform thickness over the substrate,
    the thickness of the optical path control layer being larger than the aggregate thickness of the semi-transparent or transparent electrode, the reflective electrode and the organic white light emitting layer.

2. The OLED of claim 1, in which the optical path control layer is formed of a material having a light transmittivity of 90% or greater in a visible light region.

3. The OLED of claim 2, in which a thickness of the optical path control layer is 300 nm-900 nm.

4. The OLED of claim 1, in which the optical path control layer is formed of at least one combination selected from a group consisting of $Al_2O_3$, BaO, MgO, $HfO_2$, $ZrO_2$, $CaO_2$, $SrO_2$, $Y_2O_3$, $Si_3N_4$, MN, GaN, ZnS, and CdS.

5. The OLED of claim 1, in which a reflectivity of the semi-transparent or transparent electrode is in a range of 0.1% to 50% in a visible light region.

6. The OLED of claim 5, in which the reflectivity of the semi-transparent or transparent electrode is in a range of 0.1% to 30% in a visible light region.

7. The OLED of claim 5, in which the semi-transparent or transparent electrode is formed of a thin metal or a transparent conductive oxide.

8. The OLED of claim 1, in which the reflective electrode has one of a transparent conductive oxide/metal/transparent conductive oxide structure and a metal/transparent conductive oxide structure.

9. The OLED of claim 1, further comprising a low refractive index layer formed on the optical path control layer formed of a gas or a low refractive index filler.

10. The OLED of claim 9, in which the refractive index of the low refractive index layer is smaller than 1.4.

11. The OLED of claim 1, in which the organic white light emitting layer includes a hole injection layer, a hole transporting layer, a light emitting layer, an electron transporting layer, and an electron injection layer stacked between the reflective electrode and the semi-transparent or transparent electrode.

12. The OLED of claim 11, the organic white light emitting layer comprising a red light emitting layer, a green light emitting layer, and a blue light emitting layer.

13. The OLED of claim 11, in which the organic white light emitting layer is a monochromic light emitting layer comprising one of a red light emitting layer, a green light emitting layer, and a blue light emitting layer.

14. A color display apparatus, comprising:
    a bottom substrate;
    a plurality of reflective electrodes formed on the bottom substrate;
    an organic white light emitting layer formed on the reflective electrodes;
    a semi-transparent or transparent electrode formed on the organic white light emitting layer;
    a single-layered optical path control layer formed immediately on the semi-transparent or transparent electrode and formed of a light transmitting material, and the optical path control layer having a uniform thickness over the bottom substrate; and
    a top substrate disposed to face the optical path control layer, wherein the optical path control layer is formed within a range of 300 nm-900 nm in thickness, and a reflectivity of the semi-transparent or transparent electrode is in the range of 0.1% to 50%.

15. The color display apparatus of claim 14, in which the optical path control layer is formed of a material having a light transmittivity of 90% or greater in the visible light region.

16. The color display apparatus of claim 15, in which the optical path control layer is formed of at least one combination selected from a group consisting of $Al_2O_3$, BaO, MgO, $HfO_2$, $ZrO_2$, $CaO_2$, $SrO_2$, $Y_2O_3$, $Si_3N_4$, AlN, GaN, ZnS, and CdS.

17. The color display apparatus of claim 15, in which a thickness of the optical path control layer is within a range of 300 nm-900 nm.

18. The color display apparatus of claim 14, in which the reflectivity of the semi-transparent or transparent electrode is in the range of 0.1% to 30%.

19. The color display apparatus of claim 14, further comprising a lower refractive index layer formed of a gas or a low refractive index filler filled between the optical path control layer and the top substrate.

20. The color display apparatus of claim 19, in which a refractive index of the lower refractive index layer is less than 1.4.

21. The color display apparatus of claim 14, further comprising a plurality of color filters formed to respectively correspond to the reflective electrodes on a bottom surface of the top substrate.

22. A color display apparatus, comprising:
a substrate;
a plurality of reflective electrodes formed on a substrate;
an organic white light emitting layer formed on the plurality of reflective electrodes;
a semi-transparent or transparent electrode formed on the organic white light emitting layer;
a single-layered optical path control layer formed immediately on the semi-transparent or transparent electrode and formed of a light transmitting material, and the optical path control layer having a uniform thickness over the substrate, and the optical path control layer being formed within a range of 300 nm-900 nm in thickness;
a top substrate disposed to face the optical path control layer; and
a plurality of color filters formed on the top substrate, in correspondence with the plurality of reflective electrodes.

* * * * *